(12) United States Patent
Fuller

(10) Patent No.: US 10,594,094 B2
(45) Date of Patent: Mar. 17, 2020

(54) IMPROVEMENTS TO ELECTRICAL APPARATUS

(71) Applicant: PACE PLC, Shipley, Bradford, Yorkshire (GB)

(72) Inventor: Colin Fuller, Shipley (GB)

(73) Assignee: ARRIS Enterprises LLC, Suwanee, GA (US)

( * ) Notice: Subject to any disclaimer, the term of this patent is extended or adjusted under 35 U.S.C. 154(b) by 0 days.

(21) Appl. No.: 15/534,548

(22) PCT Filed: Dec. 2, 2015

(86) PCT No.: PCT/GB2015/053675
§ 371 (c)(1),
(2) Date: Jun. 9, 2017

(87) PCT Pub. No.: WO2016/092265
PCT Pub. Date: Jun. 16, 2016

(65) Prior Publication Data
US 2017/0324199 A1  Nov. 9, 2017

(30) Foreign Application Priority Data

Dec. 12, 2014 (GB) .................................. 1422130.3

(51) Int. Cl.
*H01R 24/76* (2011.01)
*H01R 12/72* (2011.01)
*H01R 24/38* (2011.01)

(52) U.S. Cl.
CPC .......... *H01R 24/76* (2013.01); *H01R 12/724* (2013.01); *H01R 24/38* (2013.01)

(58) Field of Classification Search
CPC ........ H01R 24/52; H01R 24/76; H01R 13/46; H01R 13/502; H01R 13/512; H01R 13/514; H01R 13/5208
See application file for complete search history.

(56) References Cited

U.S. PATENT DOCUMENTS

| 3,594,687 | A | * | 7/1971 | Alderfer | H01R 24/50 439/581 |
| 3,757,272 | A | * | 9/1973 | Laramee | H01P 5/085 333/238 |
| 3,876,277 | A | * | 4/1975 | Colwell | H01R 13/746 439/551 |

(Continued)

FOREIGN PATENT DOCUMENTS

| EP | 415601 A2 | 1/1996 |
| JP | 2000183613 A | 6/2000 |

*Primary Examiner* — Oscar C Jimenez
(74) *Attorney, Agent, or Firm* — Stewart M. Wiener

(57) ABSTRACT

The invention relates is to apparatus and components which can be provided and used in order to improve the manufacture of electrical apparatus which includes one or more connectors for the connection of one or more cables thereto. One type of connector to which the invention is suited is known as an F type connector. The invention allows a connection to be achieved using securing means to secure the connector body to a housing wall and access to be gained to the securing means whilst allowing the securing means to be substantially masked from external view as the securing means are substantially located with a recess portion formed in the wall.

17 Claims, 6 Drawing Sheets

(56) References Cited

U.S. PATENT DOCUMENTS

| | | | | |
|---|---|---|---|---|
| 4,273,407 | A | * | 6/1981 | Snuffer ............... H01R 24/52 439/579 |
| 4,368,940 | A | * | 1/1983 | Sugiura ............... H01R 24/52 439/170 |
| 4,541,683 | A | * | 9/1985 | Van Domelen ........ H01R 24/52 439/101 |
| 4,631,505 | A | * | 12/1986 | Schiavone ............. H01P 5/085 333/260 |
| 4,721,481 | A | * | 1/1988 | Grellmann ............ H01R 24/52 439/551 |
| 5,192,216 | A | * | 3/1993 | Knauber ............ H01R 13/6582 439/108 |
| 5,215,477 | A | | 6/1993 | Weber et al. |
| 5,228,873 | A | * | 7/1993 | Hirai ................ H01R 12/7023 439/607.4 |
| 5,769,661 | A | * | 6/1998 | Nealis ................ H01R 24/52 439/546 |
| 6,179,622 | B1 | * | 1/2001 | Lai .................... H01R 13/512 439/607.35 |
| 6,409,550 | B1 | * | 6/2002 | Splichal ............ H01R 13/6315 439/289 |
| 6,790,080 | B2 | * | 9/2004 | Cannon ............... H01R 13/622 439/540.1 |
| 7,114,956 | B2 | * | 10/2006 | Kreitzer ............... H01R 13/625 439/63 |
| 8,113,877 | B2 | * | 2/2012 | Chang ................ H01R 13/748 439/578 |
| 2005/0077981 | A1 | * | 4/2005 | Tsao ................... H01R 9/0506 333/182 |
| 2010/0315183 | A1 | * | 12/2010 | Matsuzaki ........... H05K 5/0247 334/85 |
| 2013/0316576 | A1 | | 11/2013 | Fackler |

* cited by examiner

IMPROVEMENTS TO ELECTRICAL APPARATUS

The invention to which this application relates is to apparatus and components which can be provided and used in order to improve the manufacture of electrical apparatus and, in particular, although not necessarily exclusively, apparatus which includes one or more connectors for the connection of one or more cables thereto. Furthermore, the invention is particularly, although not necessarily exclusively, related to connectors in a form which is known as an F type connector.

An F type connector allows coaxial radio frequency (RF) cables to be connected thereto and to allow the transfer of data between the cable and the apparatus on which the connector is provided. RF cables are frequently used to carry data for use in the provision of terrestrial television, cable television and/or satellite television services.

The F type connector typically includes a socket for the receipt and connection of an outer conductive braid of the cable and a second socket mounted coaxially with the first socket and typically at the centre thereof, for receipt of an inner conductor which is formed of a solid conductive wire. A plug is typically located on the end of the cable and the plug is formed to guide the braid and wire into location with the respective sockets of the connector, and the plug engages with the connector to maintain the connection between the cable and the connector. The connector is typically located on a housing of the apparatus such that the sockets of the connector are externally available and the connector is mechanically located with the plug via the connection of the internal thread on the body of the plug with a threaded outer wall of the connector and which is exposed externally of the housing so as to allow the receipt thereon of the plug such that the inner conductor wire from the cable is located in the centrally mounted second socket in the connector.

In addition, the connector is mounted on the housing, by the location of a nut which is threadedly moved along the threaded wall of the connector to engage with the external wall of the housing on which the connector is engaged. A base, or further nut, is provided on the opposing side of the wall such that the nut which is moved along the threaded wall of the connector secures the connector in position.

It is generally regarded that the provision of the nut in contact with the external wall of the housing, which is typically metal, achieves the additional requirement of providing good electrical contact between the connector and the metal wall of the housing and achieves a screening effect which can be an important feature for good radio frequency performance of the connector. However a problem with this conventional form of assembly is that the location of the nut on the external face of the housing wall is unsightly, can be technically problematic during assembly of the apparatus and in subsequent maintenance of the apparatus and can adversely affect the overall design of the housing.

These problems are further exacerbated when, as is increasingly the case, the housing is formed by a metal casing which is at least partially enclosed by an external casing which is made from a plastics material. This means that if the nut is provided on the connector in the conventional manner it is provided in contact with the internal casing formed of metal. This, in turn, means that if the outer plastic casing is to subsequently be provided, the outer plastic casing is required to be provided with a relatively large aperture which is accurately located with respect to the location of the F Type connector so as to allow the nut to be located in the aperture and/or for access to be gained to the connector nut by a tool in order to allow the nut to be subsequently released if required. A possible alternative is for the nut to be tightened onto the plastic casing rather than the metal casing but this does not achieve the good electrical connection or screening. Furthermore, it can be found that this causes the plastic casing to warp and can cause alignment issues.

The problems caused are becoming increasingly prevalent due to the increased demand for the apparatus housing to be reused and/or for maintenance or upgrade steps to be performed on the apparatus and which can therefore require access to the securing nut of the connector to be possible and, if the nut cannot be easily accessed or removed then a significant increase in the time required for these actions to be performed occurs.

The aim of the present invention is therefore to provide a means whereby the connector can be secured to a housing in a manner which is relatively non-invasive and which allows the securing means to be accessible thereafter.

In accordance with a first aspect of the invention there is provided a housing for electrical apparatus, said housing including at least one wall with an aperture for the location therein of a cable connector body, said body provided for the receipt thereon of a securing means to allow the connector body to be secured to a portion of the wall of the housing adjacent the aperture and wherein the said portion is provided as a recessed portion of the said wall.

In one embodiment the extent of recess is the same, or substantially the same, as the depth of the securing means so that the external face of the securing means, when it is in position to secure the connector, lies flush, or substantially flush, with the remainder of the external face of the said wall of the housing.

In one embodiment, the housing comprises front and rear walls, opposing sidewalls, a top wall and a bottom wall and the connector, aperture and recessed portion are provided on the rear wall.

In one embodiment the housing includes an internal casing and an outer casing and the securing means and connector are located on a wall of the internal casing and in which the said recessed portion is provided.

In one embodiment, when an external casing is provided an aperture is provided in the wall of the casing through which a portion of the connector body can pass.

In one embodiment the centre point of the aperture of the outer casing lies on the same longitudinal axis as the centre point of the aperture in the inner housing.

In one embodiment the aperture in the outer casing is of a dimension which is sufficient to allow the connector body to pass therethrough. Typically the outer casing masks the securing means from view from externally of the housing.

Typically the aperture is of a dimension which is sufficient to allow the connector body to pass therethrough but does not need not be of a dimension to allow the securing means to pass therethrough as the same is located in the recess portion of the wall of the inner casing. This therefore means that the securing means is visually masked from externally of the housing.

In one embodiment the connector body includes a threaded portion for the receipt of a threaded securing means.

In one embodiment, the housing contains one or more printed circuit boards and at least one of which is connected to the said connector. In one embodiment the said printed circuit board is provide with an edge profile which includes a recessed portion which when the printed circuit board is in position in the housing lies adjacent to the recessed portion of the wall and hence the connector secured thereto.

Typically the recess of the portion of the said wall is such that the recess protrudes inwardly of the housing.

Typically there are provided as many apertures and recessed portions in the said wall of the housing as required to accommodate each of the connectors.

In one embodiment the securing means is a nut.

In one embodiment the connector is an F-Type connector.

In a further aspect of the invention there is provided a cable connector assembly, said assembly including a sheet material with an aperture, a cable connector body passing through the aperture, a securing means received on the body to secure the connector body to a portion of the sheet material adjacent the aperture and wherein the said portion is provided as a recessed portion of the said sheet material and in which the said aperture is located.

In one embodiment the sheet material forms a wall of a housing for electrical apparatus.

In a further aspect of the invention there is provided electrical apparatus including a housing as herein defined. In one embodiment the electrical apparatus is provided for the reception of data to allow television and/or radio services to be provided.

In a further aspect of the invention there is provided electrical apparatus including a cable connector assembly as herein defined.

In a further aspect of the invention there is provided electrical apparatus including a housing and cable connector assembly as herein described.

Specific embodiments of the invention are now described with reference to the accompanying drawings; wherein FIG. 1 illustrates part of the component with which two F Type connectors are provided;

Figure 6A:
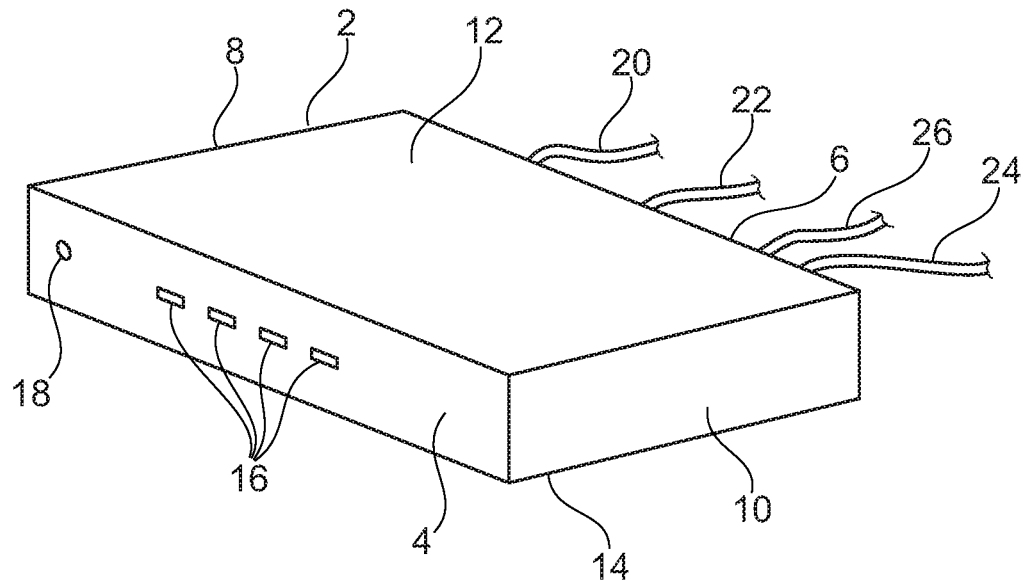
Figure 6B:
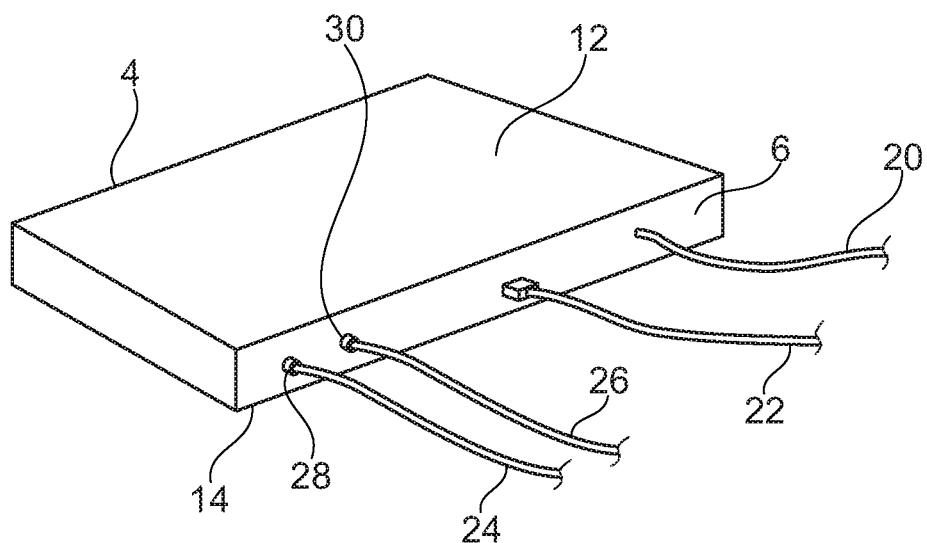

FIGS. 6a and b illustrate a perspective view of one embodiment of an item of apparatus in accordance with the invention.

Referring firstly to FIGS. 6a and b there is illustrated an item of apparatus 2 which includes a housing with front and rear faces 4, 6, opposing side walls 8,10, top wall 12 and bottom wall 14. Within the housing is provided processing means which are provided, in this embodiment for the processing of received data in order to provide television and/or radio services. The processing means are provided in a conventional format and therefore is not described in detail here. The front face 4 of the housing includes a plurality of user control functions 16 which can, for example, be any combination of on/off button, channel selection, volume selection or the like. In addition one or more light sources 18 can be provided to indicate the particular status of the apparatus.

The rear face 6 of the housing includes a plurality of connections which, in this arrangement, include a power cable connection 20, an HDMI cable connection 22 to allow the video and/or audio data to be transmitted to a display screen and/or speakers and two coaxial cables 24,26 which are connected to respective F type connectors 28, 30.

In accordance with this embodiment of the invention, the housing is formed by an inner casing 32 formed of metal and an outer casing 33 formed of plastics material in a manner which will be described hereonin.

Figure 1:
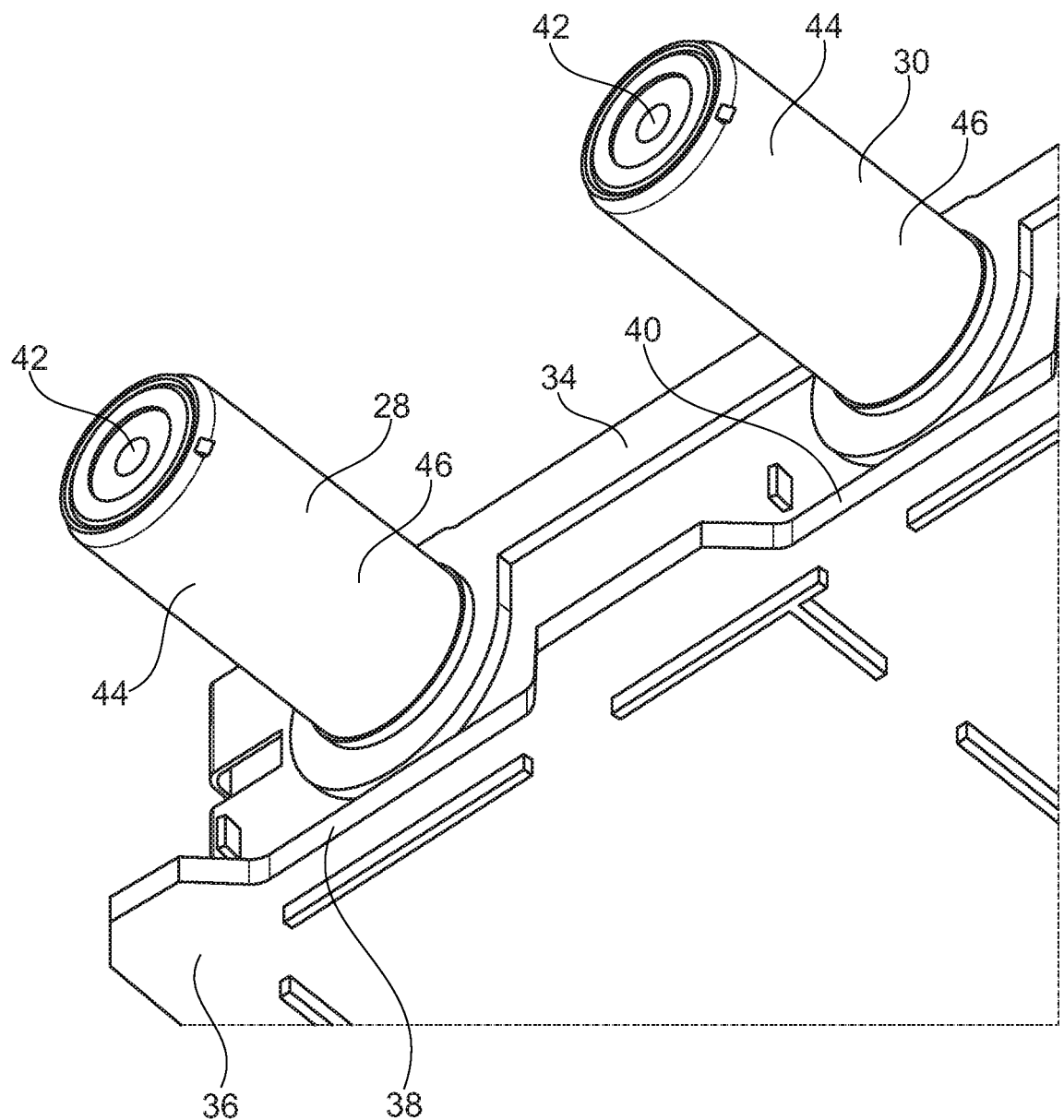

Turning now to FIG. 1 there is illustrated the two F Type connector bodies 28, 30. The bodies are mounted on an assembly 34 including one or more printed circuit boards 36 which have an edge profile which includes recesses 38, 40 respectively and located at the location of the respective connector bodies 28, 30. Each of the connector bodies includes a centrally mounted socket 42 for the receipt of a conductive wire of the coaxial cable 24, 26, a socket 44 for the contact of the conductive braid of the coaxial cable and a threaded outer wall portion 46.

Figure 2:
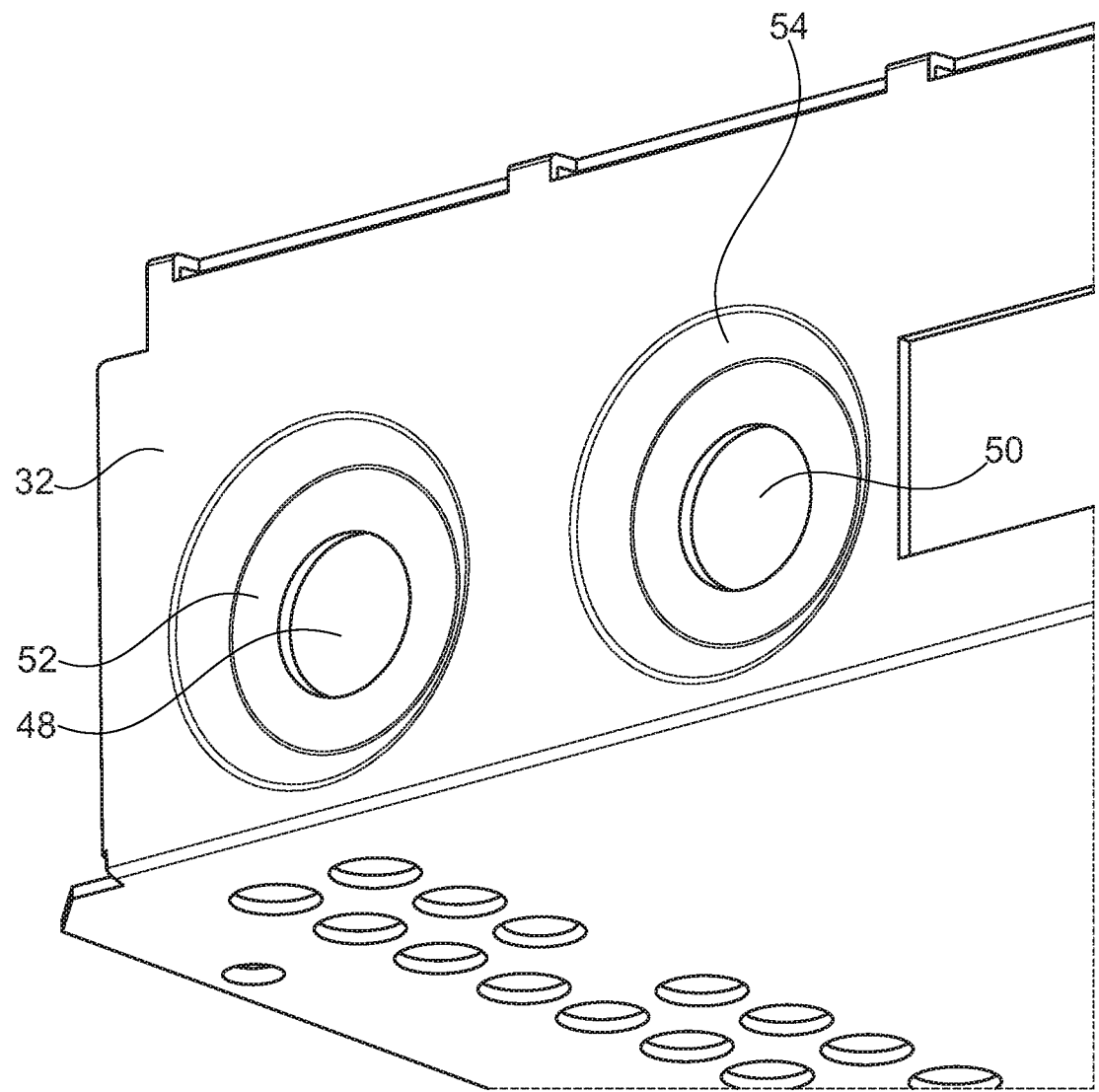
FIG. 2 illustrates part of an inner casing of a housing for an item of electrical apparatus in accordance with the invention.

In FIG. 2 the portion of the internal casing 32 in which the connector bodies 28,30 are located, is shown. The internal casing includes first and second apertures 48, 50 for the location of respective connectors bodies 28, 30 therethrough. It is also shown that for each of the apertures and around the periphery thereof there is provided a respective recessed portion 52, 54 in which the portion is recessed inwardly of the housing casing.

The threaded outer portion 46 of the connector bodies 28, 30 is provided to allow the location thereon of the threaded inner wall of the plug (not shown) provided on the end of the cables 24,26 to thereby guide the respective cable components of the wire and braid into contact with the sockets 42, 44 of the connector bodies 28, 30 and thereby achieve the data connection and, via the threaded engagement, maintain the connection thereafter.

Figure 3:
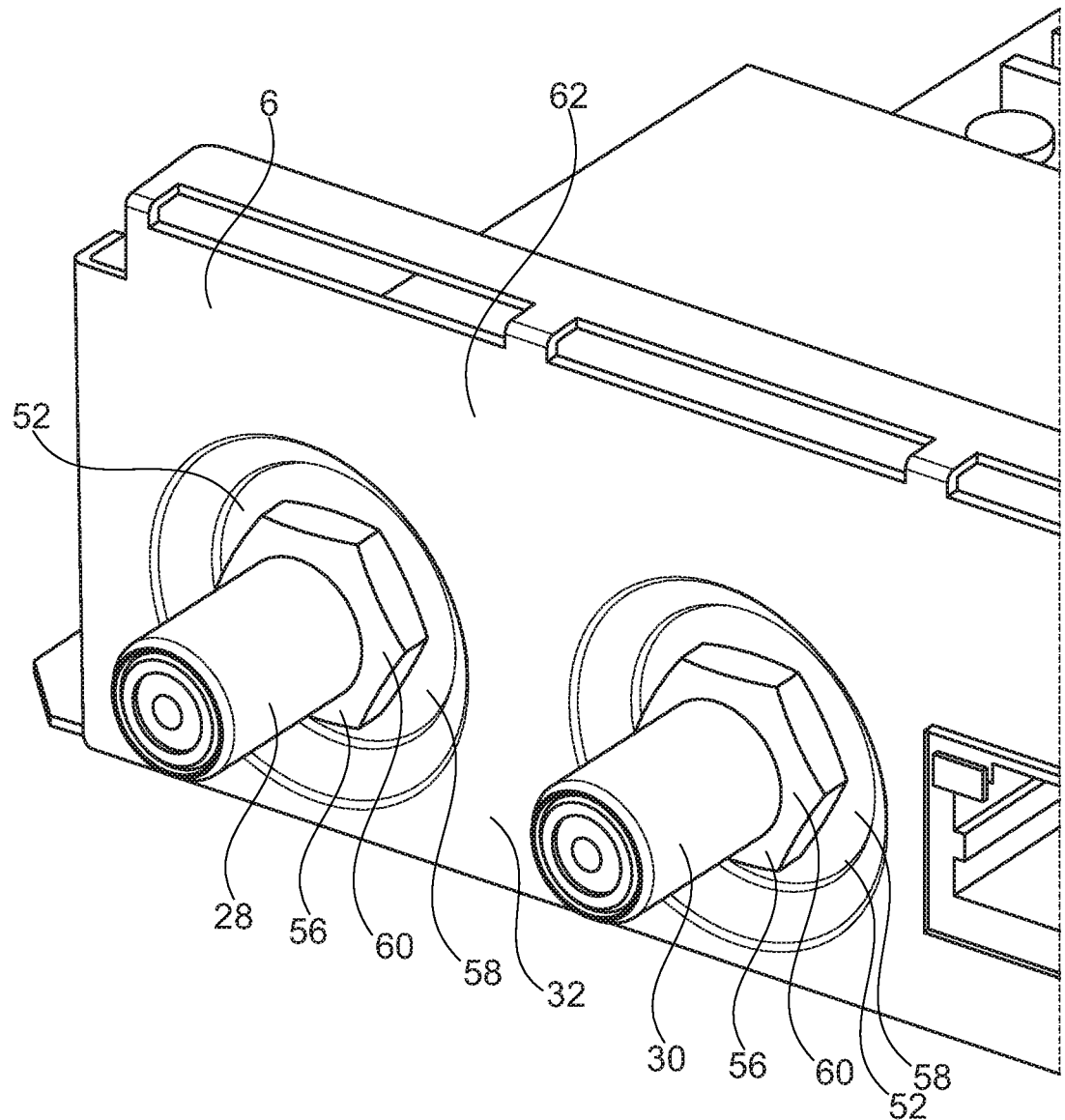
FIG. 3 illustrates the connectors of FIG. 1 in position with the casing of FIG. 2.

In addition, the threaded portion 46 of the connector bodies 28, 30 is provided to receive threaded securing means, most commonly in the form of a nut, 56, as shown in FIG. 3. The securing nut 56 is threaded onto the threaded portion, prior to any connection with the cable. The securing nut is then turned on the threaded portion 46 until the securing nut comes into contact with the outer face 58 of the respective recessed portion 52,54 and thereby sandwiches the inner casing 32 between the securing nut 56 and the inner assembly 34 and so secures the connector bodies 28,30 in position with the inner casing 32. As the securing nut is located in the respective recessed portion 52, 54 and the recess is formed to a depth which is substantially the same as the depth of the securing nut 56 so the external face 60 of the securing nut is substantially flush with the remainder of the external face 62 of the rear wall 6 as is illustrated in FIGS. 3 and 5.

Figure 4:
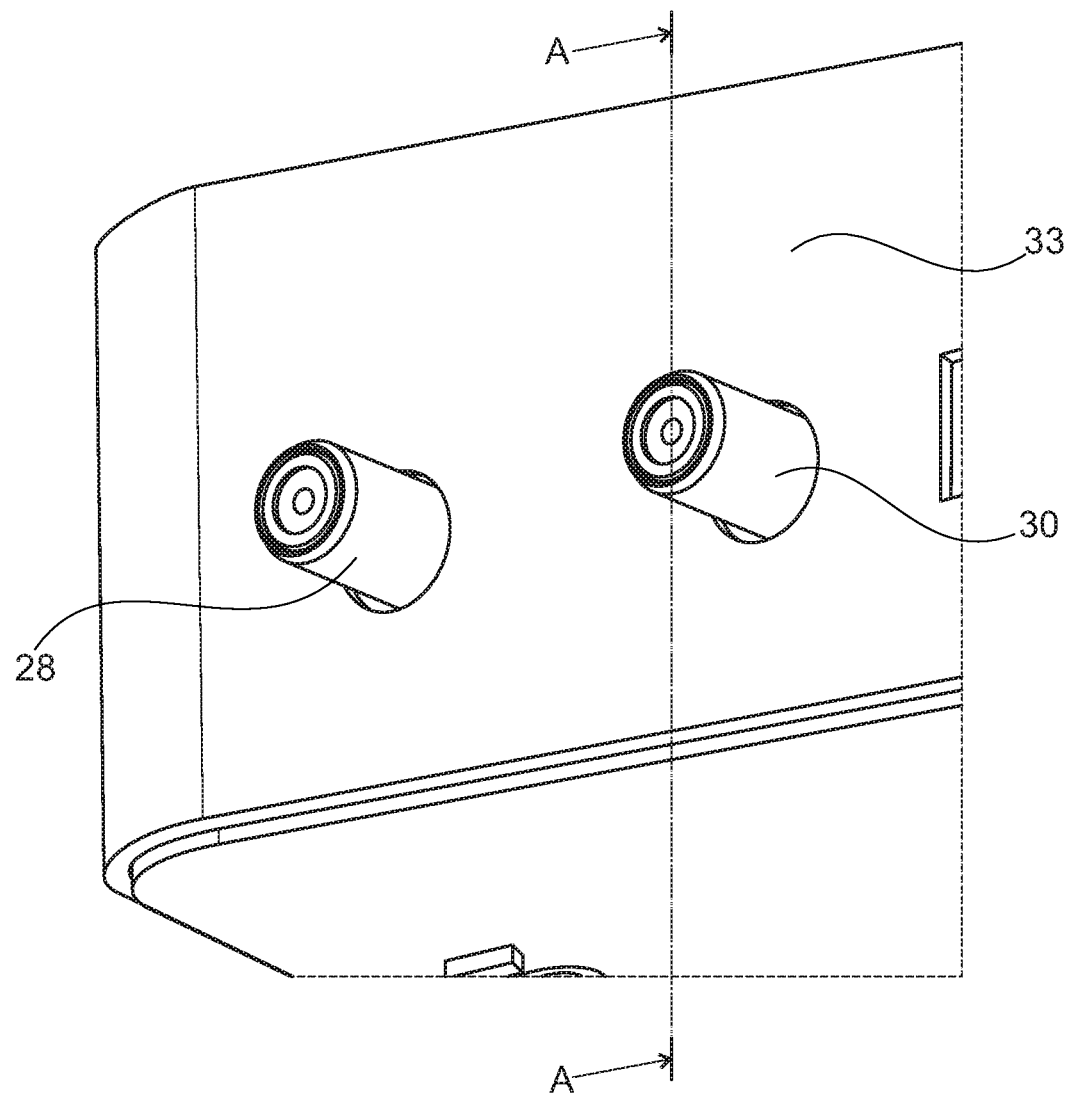
FIG. 4 illustrates the assembly of FIG. 3 with an outer casing of the housing in position.
Figure 5:
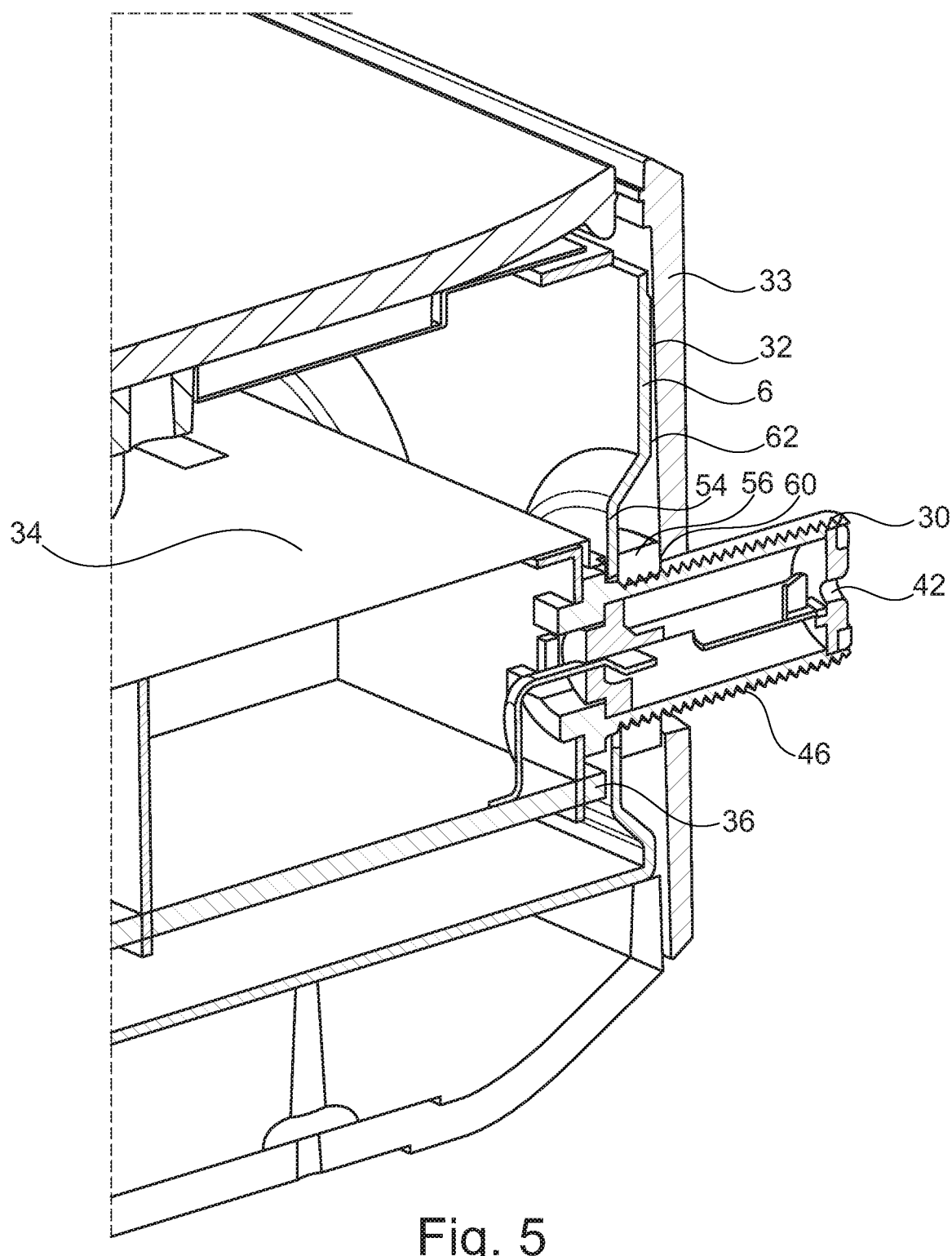
FIG. 5 illustrates a cross sectional view along line A-A of FIG. 4.

The external casing 33 is then placed into position with respect to the inner casing 32 and FIGS. 4 and 5 show the portion of the housing in which the connector bodies 28, 30 are located with the housing formed of both casings 32, 33. It is therefore shown that the outer casing 33 is required to have apertures 64, 66 formed therein to allow the outer portions of the connector bodies 28, 30 to be accessible for the subsequent connection of the cable connector plugs therewith. However, the apertures 64, 66 only need to be of a dimension to allow the bodies 28,30 to pass therethrough but, as the same do not need to receive the securing nut 56 as this is wholly located in the recessed portion of the inner casing so the apertures can be of smaller dimension than would conventionally be required.

The invention therefore allows the preferred connection to be achieved between the securing means and the inner metal casing and allows access to be gained to the securing means once the outer casing has been removed and, at the same time allows the securing means to be substantially masked from external view by the outer casing as the apertures in the outer casing can be of reduced dimension with the securing means being substantially located with the recess portion formed in the inner casing.

The invention claimed is:

1. A housing for an electrical apparatus, the housing comprising:
an internal casing and an outer casing, each of the casings having at least one wall with an aperture for the location therein of a cable connector body, the cable connector body provided for the receipt thereon of a securing fastener to allow the cable connector body to be grounded by electrically coupling the cable connector body to a recessed portion, the recessed portion formed in an external face of a sheet metal wall of the internal casing of the housing adjacent the aperture therein;
wherein the securing fastener is located in the recessed portion and the cable connector body passes through the aperture in the outer casing to be accessible for connecting a cable connector plug therewith;
wherein the housing contains one or more printed circuit boards, at least one of which is connected to the cable connector body; and
wherein the printed circuit board connected to the cable connector body is provided with an edge profile which includes a recessed portion which, when the printed circuit board is in position in the housing, lies adjacent to the recessed portion of the sheet metal wall and hence the cable connector body secured thereto.

2. The housing of claim 1, wherein the recessed portion is recessed by an extent substantially the same as a depth of the securing fastener so that a face of the securing fastener, when in position to secure the cable connector body, lies substantially flush with the face of the sheet metal wall surrounding the recessed portion.

3. The housing of claim 1, wherein:
the inner casing of the housing includes a front wall and a rear wall, opposing sidewalls, a top wall, and a bottom wall; and
the cable connector body, aperture, and recessed portion are located on the rear wall.

4. The housing of claim 1, wherein:
the housing includes the internal casing and the outer casing; and
the securing fastener and the cable connector body are located on a sheet metal wall of the internal casing in which the recessed portion is provided.

5. The housing of claim 4, wherein the aperture is provided in the wall of the outer casing through which a portion of the cable connector body passes.

6. The housing of claim 1, wherein a center point of the aperture of the outer casing lies on the same longitudinal axis as a center point of the aperture in the inner housing.

7. The housing of claim 1, wherein the aperture in the outer casing is of a dimension which is sufficient to allow the cable connector body but not the securing fastener to pass therethrough.

8. The housing of claim 1, wherein the outer casing masks the securing fastener from view externally of the housing.

9. The housing of claim 1, wherein the cable connector body includes a threaded portion for the receipt of a threaded securing fastener.

10. The housing of claim 1, wherein the recessed portion of the sheet metal wall protrudes inwardly of the housing.

11. The housing of claim 1, wherein there are provided a matching number of apertures in each of the casings, of recessed portions in the housing walls, and of cable connector bodies.

12. The housing of claim 1, wherein the securing fastener is a nut.

13. The housing of claim 1, wherein the cable connector body is a F-Type connector.

14. The housing of claim 1, further comprising the electrical apparatus included within the housing.

15. A cable connector assembly comprising:
a sheet metal material with an aperture;
a cable connector body passing through the aperture; and
a securing fastener received on the cable connector body to ground the cable connector body by electrically coupling the cable connector body to a portion of the sheet metal material adjacent the aperture;
wherein the portion is provided as a recessed portion of the sheet metal material in which the aperture is located;
wherein a housing comprising the sheet material is configured to contain one or more printed circuit boards, at least one of which is connected to the cable connector body; and
wherein the at least one printed circuit board connected to the cable connector body is provided with an edge profile which includes a recessed portion which, when the at least one printed circuit board is in position in the housing, lies adjacent to the recessed portion of the sheet metal material and hence the cable connector body secured thereto.

16. The cable connector assembly of claim 15, wherein the sheet metal material forms a wall of the housing, the housing being for an electrical apparatus.

17. The cable connector assembly of claim 16, further comprising the electrical apparatus housed within the housing.

* * * * *